United States Patent [19]

Naritomi et al.

[11] Patent Number: 4,690,886

[45] Date of Patent: Sep. 1, 1987

[54] METHOD FOR MAKING NEGATIVE WORKING O-QUINONE DIAZIDE CONTAINING DRY PLANOGRAPHIC PRINTING PLATE UTILIZING MULTIPLY LIGHT EXPOSURE, DEVELOPMENT AND BASIC TREATMENT

[75] Inventors: Yasuhisa Naritomi, Haibara; Hiroshi Takahashi, Fujieda; Keisuke Shiba, Minami-Ashigara, all of Japan

[73] Assignee: Fuji Photo Film Co., Ltd., Minami-Ashigara, Japan

[21] Appl. No.: 701,289

[22] Filed: Feb. 13, 1985

[30] Foreign Application Priority Data

Feb. 14, 1984 [JP] Japan .................................. 59-25489

[51] Int. Cl.[4] ................................................. G03F 7/08
[52] U.S. Cl. ..................................... 430/303; 430/166; 430/292; 430/309; 430/328
[58] Field of Search ............... 430/303, 166, 328, 309, 430/292

[56] References Cited

U.S. PATENT DOCUMENTS

| | | | |
|---|---|---|---|
| 1,926,322 | 9/1933 | Van der Grinten | 430/193 |
| 3,511,178 | 5/1970 | Curtin | 430/303 |
| 3,634,082 | 1/1972 | Christensen | 430/192 |
| 3,635,709 | 1/1972 | Kobayashi | 430/302 |
| 3,677,178 | 7/1972 | Gipe | 430/303 |
| 4,093,461 | 6/1978 | Loprest et al. | 430/328 |
| 4,326,020 | 4/1982 | Golda et al. | 430/328 |
| 4,342,820 | 8/1982 | Kinashi et al. | 430/303 |
| 4,358,522 | 11/1982 | Fujita et al. | 430/303 |
| 4,487,827 | 12/1984 | Berghaeuser | 430/328 |
| 4,496,647 | 1/1985 | Kowabe et al. | 430/303 |

FOREIGN PATENT DOCUMENTS 378792 7/1973 U.S.S.R. ............................. 430/192

*Primary Examiner*—Charles L. Bowers, Jr.
*Attorney, Agent, or Firm*—Fleit, Jacobson, Cohn & Price

[57] ABSTRACT

A method for making a dry planographic printing plate, which comprises: exposing through a negative transparency a dry negative working presensitized plate comprising a base substrate having provided thereon, in order, a photosensitive layer containing an orthoquinonediazide compound and a silicone rubber layer; developing the exposed plate; exposing the developed plate to light so as to make its exposure value not less than 5% of the exposure value at the time of the exposure through the negative transparency; and then treating the exposed plate with a basic compound.

9 Claims, No Drawings

METHOD FOR MAKING NEGATIVE WORKING O-QUINONE DIAZIDE CONTAINING DRY PLANOGRAPHIC PRINTING PLATE UTILIZING MULTIPLY LIGHT EXPOSURE, DEVELOPMENT AND BASIC TREATMENT

FIELD OF THE INVENTION

This invention relates to a method for making a dry planographic printing plate requiring no dampening water in which a silicone rubber layer acts as an ink repellent layer, from a negative working presensitized plate and more particularly to a dry planographic printing plate having improved practical features such as long service life in printing and resistance to solvents.

BACKGROUND OF THE INVENTION

In conventional planographic offset printing, it is known that different areas of a printing plate can be made to function as image areas and non-image areas by image-wise formation of different surface-chemical properties (oleophilic and hydrophilic properties) on the surface of the printing plate, so that dampening water fed to the non-image area forms a water film and acts as an ink repellent layer. Such planographic offset printing plates are the most widely used at present because they have the advantage that the plate-making is relatively easy and requires low cost, and the printed matters produced therewith have high quality. However, the need to use dampening water causes the following problems:

(a) Adjustment of the proper ink-water balance at a press operation is difficult and requires skill, which impedes labor-saving and automation.

(b) When printing is started or re-started after a rest interval, the ink-water balance does not become stable until a large number of sheets have been printed, so the spoilage rate is high.

(c) The printing paper undergoes expansion due to the presence of water, which is apt to cause bad registration.

(d) Due to the emulsification of the ink by dampening water, the ink adherability to the printing plate becomes poor, which creates problems both in dot reproduction and in color reproduction.

(e) The printing press must be provided with a dampening system, so it becomes large in size and high in cost.

In the hope of finding fundamental solutions to these problems, various studies have been under way for more than ten years on dry planographic printing plates using a silicone rubber layer as an ink repellent layer, Japanese Patent Publication No. 23042/1969 described for the first time the use of silicone rubber as an ink repellent layer. Since then, various types of printing plates have been proposed in, for example, U.S. Pat. No. 3,511,178, GB No. 1,399,949, GB No. 1,419,643, U.S. Pat. No. 4,358,522, GB No. 2,064,803, Japanese Patent Laid-Open Application Nos. 50102/1975 and 80047/1981. These dry planographic printing plates in which a silicone rubber layer overlays a photosensitive layer fall generally into two types: one type prepared by image-wise exposure of a presensitized plate, followed by treatment with a developer to dissolve either exposed or unexposed area of the underlying photosensitive layer and remove it together with an overlying silicone rubber layer leaving an image, and another type prepared by image-wise exposure of a presensitized plate using a photoadhesive or photoreleasable photosensitive layer, followed by development of the exposed plate so as to swell and remove only the silicone rubber layer in the unexposed area on the photoadhesive photosensitive layer or in the exposed area on the photoreleasable photosensitive layer, leaving an image.

In the former type, even if the adhesive strength between the silicone rubber layer and the photosensitive layer of the presensitized plate is designed to be very high, it is very rare that the image forming property thereof is poor or that the presensitzed plate cannot be sufficiently developed because the photosensitive layer is dissolved in the developer and is removed together with the overlaying silicone rubber layer. Therefore, it is possible to make a presensitized plate which has no protective film on the silicone rubber layer and a printing plate prepared from such a presensitized plate has stable adhesive strength of the silicone rubber, scratch-resistance, rub-resistance and high durability in printing.

In the latter type, in contrast, although it is possible to put a thinner ink layer onto the painting plate, it is impossible to develop the presensitized plate if the adhesive strength between the silicone rubber layer and the photosensitive layer is too high. Thus, it is difficult to make a dry planographic printing plate of the latter type which has sufficient scratch-resistance and rub-resistance.

When a dry presensitized plate comprising a base substrate, a photosensitive layer and a silicone rubber layer which are laminated one upon another in this order is to be made a negative working plate, it is necessary to use a photosolubilizable one as the photosensitive layer. This type of dry presensitized plate is disclosed in U.S. Pat. No. 3,511,178. When this plate is imagewise exposed to light, the photosensitive layer in the exposed area undergoes photolysis, becoming soluble in the developer, and is removed together with the overlay ing silicone rubber layer, so that the exposed area is now an image area. On the other hand, the photosolubilizable layer of a non-image or unexposed area still remains photosensitive even after the image-wise exposure, and therefore it becomes soluble when it is exposed to sunlight or light from a fluorescent tube.

There is a possibility that a printing plate may come in contact with an organic solvent similar to the solvent used for development, as in the case of treating with a plate-cleaner or applying a printing ink thereon during the press operation. Even if an excellent image has been reproduced on a printing plate after developing, a photosensitive layer of a non-image area will be removed together with the overlaying silicone rubber layer if the photosensitive layer of the non-image area comes in contact with an organic solvent to become soluble therein, so that the excellent image on the plate will be destroyed.

To solve the aforementioned problem, Japanese Patent Laid-Open Application Nos. 60947/1980 and 192956/1982 have proposed a method of fixing an image on a dry planographic printing plate by treating it with heat after exposing and developing a dry negative working presensitized plate. The process has disadvantages in that it requires a heat-treating system and that the image area cannot be sufficiently fixed so that it becomes soluble in an organic solvent when it is exposed to light after the treatment, which leads to a change in the tone of the dot image. Japanese Patent Laid-Open Application No. 205740/1982 has disclosed a method of fixing an image by treating it with a basic compound after the exposure and subsequent development. This process can be successfully applied to a dry negative working presensitized plate comprising a base substrate, a photoreleasable photosensitive layer and a silicone rubber layer coated on the substrate in this order wherein only the silicone rubber layer photoexfoliated is swelled and removed as shown in Example 3 of the reference. However, this process cannot be successfully applied to a dry presensitized plate wherein a photosensitive layer thereof is dissolved in the developer and removed together with the overlaying silicone rubber layer, as shown in Examples 1 and 2 of the reference.

SUMMARY OF THE INVENTION

Accordingly, an object of this invention is to provide a method for making a dry planographic printing plate, the performance of which is not deteriorated by exposure to light after it is made.

The object of this invention is accomplished by imagewise exposing and developing a presensitized plate, exposing the developed plate to light so as to make its exposure value not less than 5% of the exposure value at the time of the image-wise exposure and then, treating it with a basic compound.

This invention is a method for making a dry planographic printing plate, which comprises:

exposing through a negative transparency a dry negative working presensitized plate comprising a base substrate having provided thereon, in order, a photosensitive layer containing an orthoquinonediazide compound and a silicone rubber layer;

developing the exposed plate;

exposing the developed plate to light so as to make its exposure value not less than 5% of the exposure value at the time of the exposure through the negative transparency; and then, treating the exposed plate with a basic compound.

DETAILED DESCRIPTION OF THE INVENTION

The orthoquinonediazide compound used in this invention is a compound having a 2-diazo-1-naphthol structure in the molecule, which is typically obtained by reaction between a 2-diazo-1-naphthol sulfonic acid derivative such as sulfonic acid chloride and a compound containing hydroxyl or amino group. In this invention, it is generally possible to use compounds of any structure which can be used in a conventional positive working presensitized plate requiring dampening water. Among them, 2-diazo-1-naphtholsulfonate of novolak resin and 2-diazo-1-naphtholsulfonate of polyhydroxy-phenyl prepared by polycondensation of acetone and pyrogallol are preferable and the latter is most preferable.

The silicone rubber used in this invention may be any one which is capable of forming an ink repellent layer and includes one-component room temperature vulcanizing silicone rubber, two-component silicone rubber for use in release paper, two-component addition-reaction type silicone rubber and a mixture of two-component addition-reaction type silicone rubber and one-component room temperature vulcanizing silicone rubber described in Japanese Patent Publication No. 12860/1981.

The dry negative working presensitized plate according to this invention comprises a base substrate, a primer coating layer, a photosensitive layer, an adhesive layer and a silicone rubber layer which are laminated one upon another in this order. The primer coating layer and the adhesive layer may be omitted. The photosensitive layer is preferably 0.05 to 3 microns in thickness. The silicone rubber layer should be as thin as possible for good tone reproduction but should have some degree of thickness for good durability in printing and for avoiding scumming or tinting. Its thickness, therefore, is preferably 0.5 to 10 microns, and more preferably 1.0 to 3.0 microns. The primer coating and the adhesive layers are preferred to be as thin as they can possibly be made without impairing their performance.

The photosensitive layer may contain epoxy resin, which intensifies the fixing effect after the development and improves resistance to solvents of the resulting printing plate. Typical examples of the epoxy resin include a reaction product of epichlorohydrin and polyhydric phenol such as bisphenol A, or a novolak-epoxy resin which is a reaction product of epichlorohydrin and novolak. The epoxy resin can be contained in the photosensitive layer in the amount of from 0 to 50, preferably from 0 to 20 percent by weight based on the solid content of the photosensitive layer.

The dry negative working presensitized plate is exposed through a negative transparency and is developed. The image-wise exposure is carried out to the extent that the fourth step of the step tablet (a product of Fuji Photo Film Co., Ltd.), if it is exposed, becomes solid.

Examples of developers which can be used in this invention include a mixture of (i) an alcohol such as ethyl, isopropyl or n-propyl alcohol, a glycol such as mono-methyl, mono-ethyl, mono-n-propyl or mono-n-butyl ether of ethylene glycol, or mono-methyl, mono-ethyl or mono-n-butyl ether of diethyleneglycol, or benzyl alcohol, and (ii) a petroleum solvent such as hexane, heptane or isoparaffin which can swell the silicone rubber layer.

After the image-wise exposure and the subsequent development, the printing plate thus treated is overall exposed to light so as to make its exposure value not less than 5% of the appropriate exposure value at the time of the image-wise exposure. In the case of an exposure value of less than 5%, it is impossible to obtain a sufficient fixing effect even if the treatment with a basic compound described hereinafter is followed. Although the upper limit of the exposure value of the overall exposure is not critical, there is a tendency for appropriate fixing not to be effected when the overall exposure value is more than 300% of the appropriate value of the image-wise exposure. Such a high overall exposure value is also uneconomical. In view of the above, it is preferred that the overall exposure value be 5 to 300%, preferably 10 to 100% and more preferably 10 to 50% of the appropriate exposure value at the time of the image-wise exposure.

The printing plate thus overall exposed is then treated with a basic compound. Typical examples of the basic compound include amines, alkali metal alcoholates and alkali metal amides. The amines include mono- or polyamines such as di-, tri- or tetra-amine, of primary, secondary or tertiary aliphatic cyclic or acyclic, aromatic or heterocyclic amines, particularly, ammonia, methyl, dimethyl, trimethyl, ethyl, diethyl, triethyl, n- or isopropyl, dipropyl, tripropyl, butyl, dibutyl, tributyl, amyl, diamyl or methyl diethyl amine, ethylenediamine, trimethylenediamine, tetramethylenediamine, ethanolamine, diethanolamine, triethanolamine, benzylamine, dimethylbenzylamine, diethylbenzylamine, dipropylbenzylamine, o-, m- or p-methoxy-benzylamine, N,N-dimethylbenzylamine, β-phenylethylamine, ε-phenylamylamine, δ-phenylamylamine, γ-phenylpropylamine, cyclohexylamine, aniline, monomethylaniline, dimethylaniline, toluidine, naphthylamine, phenylenediamine, pyrrolidine, piperidine, piperazine, morpholine, urotropin, pyrrole, pyridine, quinoline, hydrazine, phenylhydrazine, diphenylhydrazine, hydroxylamine, urea, glycine, alanine, phenylalanine, tetraalkylammonium hydroxide and the like.

Examples of alkali metal alcoholates include methylates, ethylates and propylates of sodium, potassium or lithium and examples of alkali metal amides include amides, diethylamides and dipropylamides of sodium, potassium or lithium. Alkali metal hydroxides such as lithium, sodium or potassium hydroxide can also be used as the basic compound in this invention.

In this invention, the basic compound is used alone or in a combination of two or more, in the form of liquid or gas. In the case of liquid form, the basic compound is used as it is, if it is liquid, or as a solution in a solvent such as water, an organic solvent or a mixture thereof.

The overall exposed printing plate is treated by dipping it in the basic compound if it is liquid, or in the solution of the basic compound, or by bringing it into contact with a gas of the basic compound. The time required to treat the overall exposed printing plate with the basic compound depends on the concentration of the basic compound and it is usually in the range of about 1 to 10 minutes. The treatment with the basic compound may be continued for more than 10 minutes but it does not result in further effect. The temperature at which the plate is treated is not critical and it is typically in the range of 10° C. to 30° C.

The printing plate made by the method of this invention is excellent in such properties as tone reproduction, durability in printing and scratch resistance, which properties are retained and not deteriorated even if the plate is exposed to light of the sun, a fluorescent tube or the like. Thus, this invention provides, without heat-treatment at an elevated temperature, a dry planographic printing plate having high durability in printing, high scratch resistance and good tone reproduction.

This invention will now be explained more in detail with reference to the following Examples to which this invention is not restricted in any way.

EXAMPLE 1

An aluminum plate degreased by a conventional method was coated with a solution of one part by weight of N-β-(aminoethyl-γ-aminopropyl trimethoxy silane (a silane coupling agent SH-6020, a product of TORAY SILICONE COMPANY) in 500 parts by weight of ethanol and dried. It was then coated with a photosensitive solution of 10 parts by weight of 2-diazo-1-naphthol-5-sulfonate of polyhydroxy-phenyl prepared by polycondensation of acetone and pyrogallol (described in the specification of U.S. Pat. No. 3,635,709) in a mixed solvent of 120 parts by weight of methyl cellosolve acetate and 60 parts by weight of methyl ethyl ketone in the amount of 1g/m$^2$ (dry weight) and was then dried to form a photosensitive layer.

A solution of one part by weight of N-β-(aminoethyl)-γ-aminopropyl trimethoxy silane (the silane coupling agent SH-6020, a product of TORAY SILICONE COMPANY) in 500 parts by weight of xylene was filtered and then was coated on the photosensitive layer, which was then coated with a solution of 9 parts by weight of one-component silicone rubber RTV deacetic acid type (SHINETSU SILICONE KE 41 T, a product of SHINETSU CHEMICAL), 3.3 parts by weight of two-component silicone rubber for releasing (SHINETSU SILICONE KS 709, a product of SHINETSU CHEMICAL) and 0.04 part by weight of a catalyst (CAT-PS, a product of SHINETSU CHEMICAL) in 150 parts by weight of Iso Par G (a product of STANDARD CHEMICAL) in the amount of 2g/m$^2$ (dry weight), dried at 100° C. for 2 minutes and kept in a dark place overnight to complete setting.

The dry presensitized plate thus prepared was exposed for 30 seconds through a negative transparency and a step tablet (a product of FUJI PHOTO FILM CO., LTD.) in close contact therewith by a vacuum printer (a product of BTC ASCOR COMPANY) and then rubbed for 3 minutes with HONEYRON RISOPAD (nonwoven textile, produced by HONEY FIBER COMPANY) soaked in a developer consisting of 75 parts by weight of ethyl alcohol and 25 parts by weight of Iso Par G. As a result, the photosensitive layer and the overlying silicone rubber layer in the exposed area were removed, whereas no change was observed in the non-image area or unexposed area and the silicone rubber layer therein remained as it was. The silicone rubber layer in the area simultaneously exposed through the sixth or higher step of the step tablet remained as it was.

The printing plate thus obtained was overall exposed to light for 10 seconds using the aforementioned printer, then immersed for one minute in a basic compound solution consisting of one part by weight of ethylenediamine and 99 parts by weight of ethanol at room temperature, washed with water and dried.

In order to ascertain whether the printing plate thus prepared was sufficiently fixed, the plate was further exposed to light for 60 seconds using the aforementioned printer and then rubbed for 3 minutes with HONEYRON RISOPAD soaked in a developer consisting of 75 parts by weight of ethyl alcohol and 25 parts by weight of Iso Par G. As a result, there was observed no damage on the surface of the printing plate, and the silicone rubber layer in the area exposed through the sixth or higher step of the step tablet remained as it was.

As a comparative Example, a printing plate was prepared as follows: The presensitized printing plate was image-wise exposed and developed in the same manner as described above. The plate thus obtained was then immersed for one minute at room temperature in the same basic compound solution without the 10-second overall exposure. The plate thus treated was exposed to light for 60 seconds using the aforementioned printer and then was rubbed for 3 minutes with the HONEYRON RISOPAD soaked in the aforementioned developer. As a result, almost all the photosensitive layer and the overlying silicone rubber layer were removed from the base substrate. This result shows that it is impossible to sufficiently fix the non-image area only by treating it with the basic compound.

EXAMPLE 2

A dry presensitized plate was prepared in the same manner as in Example 1 except that the photosensitive solution was replaced by the following composition: 8.5 parts by weight of 2-diazo-1-naphthol-5-sulfonate of polyhydroxy-phenyl obtained by polycondensation of acetone and pyrogallol and 1.5 parts by weight of an epoxy resin (EPICOAT 1007, a product of SHELL OIL COMPANY) dissolved in a mixed solvent of 120 parts by weight of methyl cellosolve acetate and 60 parts by weight of methyl ethyl ketone. The composition was coated in the amount of 1g/m2dry weight).

The presensitized printing plate thus obtained was exposed through a negative transparency and developed in the same manner as in Example 1 to prepare a printing plate, which was then overall exposed to light for 10 seconds using the vacuum printer as described in Example 1. The printing plate was then immersed for one minute at room temperature in a solution of 10 parts by weight of triethanolamine and 90 parts by weight of ethanol, washed with water and then dried to obtain a fixed printing plate.

The same test procedure as in Example 1 was repeated to ascertain whether the non-image area was fixed. As a result, it was found that the silicone rubber layer in non-image area was not damaged, that is, the non-image area was sufficiently fixed.

EXAMPLE 3

A dry presensitized plate was prepared in the same manner as in Example 2 except that the epoxy resin was replaced by a phenoxy resin (PHENOXY RESIN PKHH, a product of UNION CARBIDE). The presensitized printing plate thus obtained was exposed through a negative transparency and developed in the same manner as in Example 1 to prepare a non-fixed printing palte, which was then overall exposed to light in the same manner as in Example 1 and immersed in a basic compound solution consisiting of 2 parts by weight of benzylamine and 98 parts by weight of ethanol to complete the fixation thereof.

The printing plate thus fixed was put through the same test procedure as in Example 1 to ascertain the degree of the fixation. The test result showed that the non-image area was sufficiently fixed.

What we claim is:

1. A method for making a dry planographic printing plate, the steps comprising:
   first, exposing a dry negative working presensitized plate comprising a base substrate having provided thereon, in order, a photosensitive layer containing an orthoquinonediazide compound and a silicone rubber layer to light through a negative transparency,
   developing the exposed printing plate by a developer consisting essentially of a mixture of (i) an alcohol selected from the group consisting of ethyl, isopropyl and n-propyl alcohol, a glycol selected from the group consisting of mono-methyl, mono-ethyl, mono-propyl or mono-n-butyl ether of ethylene glycol, or mono-methyl, mono-ethyl or mono-n-butyl ether of diethylenegylcol, and benzyl alcohol, and (ii) a petroleum solvent selected from the group consisting of hexane, heptane and isoparaffin, so that the photosensitive layer and the overlying silicone rubber layer in the exposed area are removed,
   exposing the whole surface of the developed printing plate to light where the exposure value is not less than 5% of the exposure value at the time of the exposure to light through the negative transparency, and
   treating the twice exposed printing plate with a liquid or gaseous basic compound.

2. The method of claim 1, wherein the photosensitive layer contains an epoxy resin.

3. The method of claim 1, wherein the whole surface of the developed printing plate is exposed to light where the exposure value is 5 to 300% of the exposure value at the time of the exposure to light through the negative transparency.

4. The method of claim 1, wherein the whole surface of the developed printing plate is exposed to light where the exposure value is 10 to 100% of the exposure value at the time of the exposure to light through the negative transparency.

5. The method of claim 1, wherein the basic compound is selected from the group consisting of amines, alkali metal alcoholates, alkali metal amides, and alkali metal hydroxides.

6. The method of claim 2, wherein the epoxy resin is a reaction product of epichlorohydrin and polyhydric phenol, or a novolak type epoxy resin.

7. The method of claim 2, wherein the amount of the epoxy resin contained in the photosensitive layer is in the range of 0 to 50 percent by weight.

8. The method of claim 2, wherein the amount of the epoxy resin contained in the photosensitive layer is in the range of 0 to 20 percent by weight.

9. The method of claim 1, wherein the orthoquinonediazide compound is 2-diazo-1-naphtholsulfonate of novolak resin or 2-diazo-1-naphtholsulfonate of polyhydroxy-phenyl.

* * * * *